United States Patent
Kume et al.

(10) Patent No.: US 7,935,266 B2
(45) Date of Patent: May 3, 2011

(54) WET ETCHING METHOD USING ULTRAVIOLET-LIGHT AND METHOD OF MANUFACTURING SEMICONDUCTOR DEVICE

(75) Inventors: Satoshi Kume, Ibaraki (JP); Nobuyuki Hishinuma, Hyogo (JP); Hiroshi Sugahara, Hyogo (JP)

(73) Assignees: Renesas Electronics Corporation, Tokyo (JP); Ushio Denki Kabushiki Kaisha, Tokyo (JP)

( * ) Notice: Subject to any disclaimer, the term of this patent is extended or adjusted under 35 U.S.C. 154(b) by 795 days.

(21) Appl. No.: 11/964,794

(22) Filed: Dec. 27, 2007

(65) Prior Publication Data

US 2008/0113518 A1 May 15, 2008

Related U.S. Application Data

(62) Division of application No. 10/797,577, filed on Mar. 11, 2004, now abandoned.

(30) Foreign Application Priority Data

Mar. 25, 2003 (JP) .................................. 2003-081776

(51) Int. Cl.
 *B44C 1/22* (2006.01)
 *C03C 15/00* (2006.01)
 *C03C 25/68* (2006.01)
 *C23F 1/00* (2006.01)
 *C23F 3/00* (2006.01)

(52) U.S. Cl. ......................................... 216/94; 438/746

(58) Field of Classification Search ................... 216/94; 438/746
 See application file for complete search history.

(56) References Cited

U.S. PATENT DOCUMENTS

| | | | |
|---|---|---|---|
| 5,065,021 | A | 11/1991 | Arakawa |
| 5,478,401 | A | 12/1995 | Tsunekawa et al. |
| 5,510,158 | A | 4/1996 | Hiramoto et al. |
| 5,709,754 | A | 1/1998 | Morinville et al. |
| 5,763,892 | A | 6/1998 | Kizaki et al. |
| 6,631,726 | B1 | 10/2003 | Kinoshita et al. |
| 2001/0001392 | A1 | 5/2001 | Hirae et al. |
| 2003/0155000 | A1 | 8/2003 | Nenyei et al. |
| 2003/0215751 | A1 | 11/2003 | Otake et al. |
| 2004/0209194 | A1 | 10/2004 | Kume et al. |
| 2004/0211756 | A1 | 10/2004 | Kume et al. |

FOREIGN PATENT DOCUMENTS

| | | |
|---|---|---|
| JP | 60-198828 | 10/1985 |
| JP | 08-213358 | 8/1996 |
| JP | 11-323576 | 11/1999 |

(Continued)

OTHER PUBLICATIONS

Nobuyuki Hishinuma, "Surface Treatment Technology Handbook (Jan. 2000)", Excerpt from vol. 2 "Applications," Chapter 1 Treatment Methods Excimer UV (with English Translation).

*Primary Examiner* — Roberts Culbert
(74) *Attorney, Agent, or Firm* — Leydig, Voit & Mayer, Ltd.

(57) ABSTRACT

A substrate supporting film to be etched is held on a rotating stage. Ultraviolet light having a wavelength of 200 nm or shorter radiated from first lamps irradiates the film in air, thereby removing an organic coatings from the film and making the surface of the film hydrophilic. A chemical solution is applied to the hydrophilic film while rotating the substrate. Ultraviolet light having a wavelength longer than 200 nm is radiated from second lamps and onto the film through the chemical solution.

8 Claims, 6 Drawing Sheets

FOREIGN PATENT DOCUMENTS

| | | | | | |
|---|---|---|---|---|---|
| JP | 2001-068448 | 3/2001 | JP | 2002-184742 | 6/2002 |
| JP | 2001-172416 | 6/2001 | JP | 2002-316041 | 10/2002 |
| | | | JP | 2003-337432 | 11/2003 |

WET ETCHING METHOD USING ULTRAVIOLET-LIGHT AND METHOD OF MANUFACTURING SEMICONDUCTOR DEVICE

FIELD OF THE INVENTION

The present invention relates to an apparatus for manufacturing a semiconductor device, and specifically relates to a wet-etching apparatus provided with ultraviolet-light radiation apparatus, a wet-etching method, and a method of manufacturing a semiconductor device.

DESCRIPTION OF THE BACKGROUND ART

Background art, not prior art, includes a wet-etching method wherein, after a chemical solution is applied to a film to be processed on a substrate, ultraviolet light irradiates the film through the chemical solution to break the molecular bonds of the film, as described in Japanese Patent Application No. 2003-21566 (FIG. 1).

However in a predetermined atmosphere, an organic coating (e.g., oil) may be formed on the film to be processed before wet etching. Since the organic coating makes the film water-repellent, the contact angle between the chemical solution and the film increases. Thus, the wetting properties of the chemical solution will be lowered. If sufficient wetting properties cannot be obtained, there has been a problem that the chemical solution cannot be coated evenly, and the uniformity of the etching rate within the substrate is deteriorated.

If the contact angle between the chemical solution and the film is large, as described above, the coating of the chemical solution 31 is thick as FIG. 5 shows. In a wet-etching method wherein ultraviolet light irradiates the film on the substrate 5 through the chemical solution 20, the thick chemical solution 31 interferes with the transmission of the ultraviolet light, and the light energy of the ultraviolet light is attenuated in the chemical solution 31. Therefore, there has been a problem that the effect of breaking the molecular bonds of the film to be processed is weakened, and the desired etching rate cannot be achieved.

In wet etching by radiating ultraviolet light in an ambient containing oxygen, if ultraviolet light of a wavelength having a high absorption coefficient in oxygen is used, the light energy of the ultraviolet light is attenuated before the ultraviolet light reaches the film to be processed. In this case also, the effect of breaking the molecular bonds of the film to be processed is weakened, leading to the loss of light energy. In order to solve such a problem, there is a method for wet etching in an inert gas, such as nitrogen ($N_2$), to lower the oxygen content to a predetermined value or below. However, to realize this method, there has been a problem of increased equipment costs because of the necessity to provide the etching apparatus with a sealing mechanism 32 as FIG. 6 shows, and increased operation costs due to the wasteful consumption of the inert gas. Also since the displacement of atmosphere in the sealing mechanism 32 is necessary, there has been a problem of requiring a long treatment time, and a lowered throughput.

SUMMARY OF THE INVENTION

The present invention has been conceived to solve the previously-mentioned problems and a general object of the present invention is to provide novel and useful ultraviolet-light radiating apparatus, wet etching apparatus, wet etching method, and method of manufacturing a semiconductor device.

A more specific object of the present invention is to provide a wet etching apparatus and a wet etching method that can achieve a high etching rate, and excel in the uniformity of the etching rate within the substrate.

The above object of the present invention is attained by a following ultraviolet-light radiating apparatus, a following wet etching apparatus, a following wet etching method, and a following method of manufacturing a semiconductor device.

According to first aspect of the present invention, the ultraviolet-light radiating apparatus for radiating ultraviolet light to a film to be processed on a substrate, comprises first ultraviolet-light radiating units for radiating ultraviolet light having a wavelength of 200 nm or shorter; and second ultraviolet-light radiating units for radiating ultraviolet light having a wavelength longer than 200 nm.

According to second aspect of the present invention, the wet etching apparatus comprises a stage for holding a substrate having a film to be etched. First ultraviolet radiating units radiate ultraviolet light having a wavelength of 200 nm or shorter to the film. A chemical-solution coating unit coats a chemical solution on the film. Second ultraviolet radiating units radiate ultraviolet light having a wavelength longer than 200 nm to the film through the chemical solution.

According to third aspect of the present invention, in the wet etching method, first ultraviolet light having a wavelength of 200 nm or shorter is first radiated to a film to be etched on a substrate. A chemical solution is coated on the film after radiating the first ultraviolet light, Second ultraviolet light having a wavelength longer than 200 nm is radiated to the film through the chemical solution.

According to fourth aspect of the present invention, in the method of manufacturing a semiconductor device, a high-k dielectric film is first formed on a substrate. A gate electrode is formed on the high-k dielectric film. First ultraviolet light having a wavelength of 200 nm or shorter is radiated to the high-k dielectric film. A chemical solution is coated on the high-k dielectric film after radiating the first ultraviolet light. Second ultraviolet light having a wavelength longer than 200 nm is radiated to the high-k dielectric film through the chemical solution. Diffusion regions are formed in the substrate after radiating the second ultraviolet light.

Other objects and further features of the present invention will be apparent from the following detailed description when read in conjunction with the accompanying drawings.

DETAILED DESCRIPTION OF THE PREFERRED EMBODIMENTS

Figure 1:
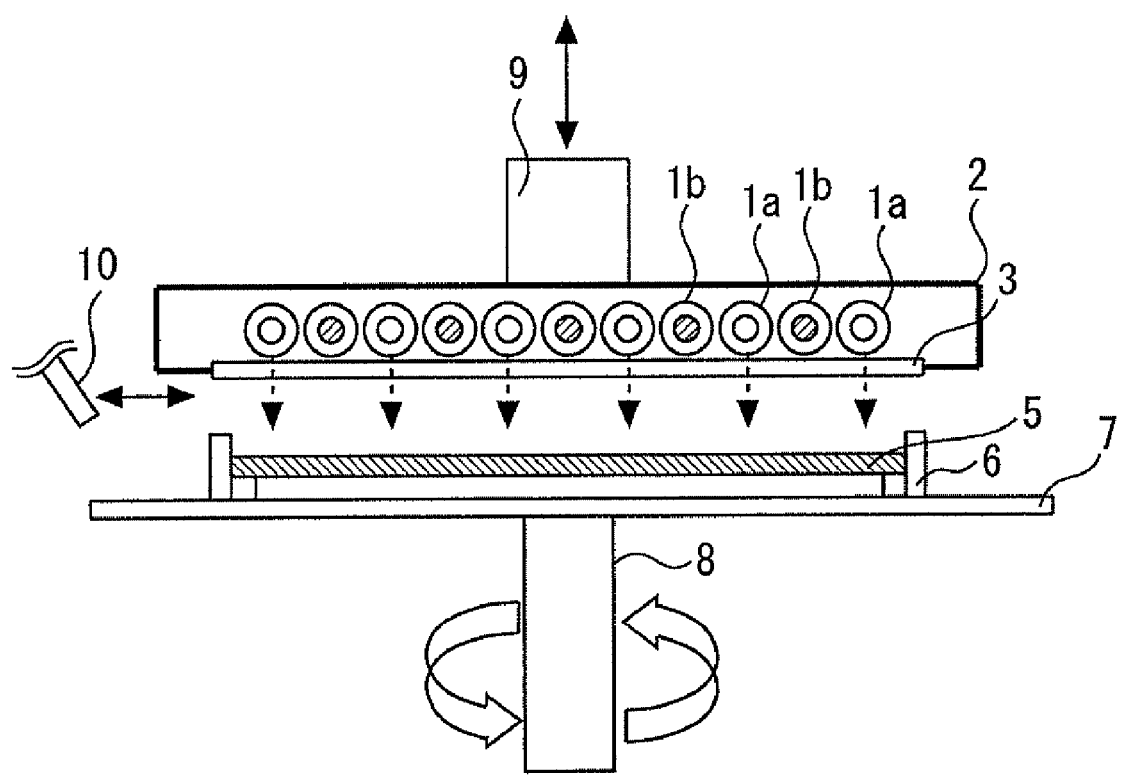
FIGS. 1 and 2 are schematic sectional views for illustrating a wet etching apparatus according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 2:
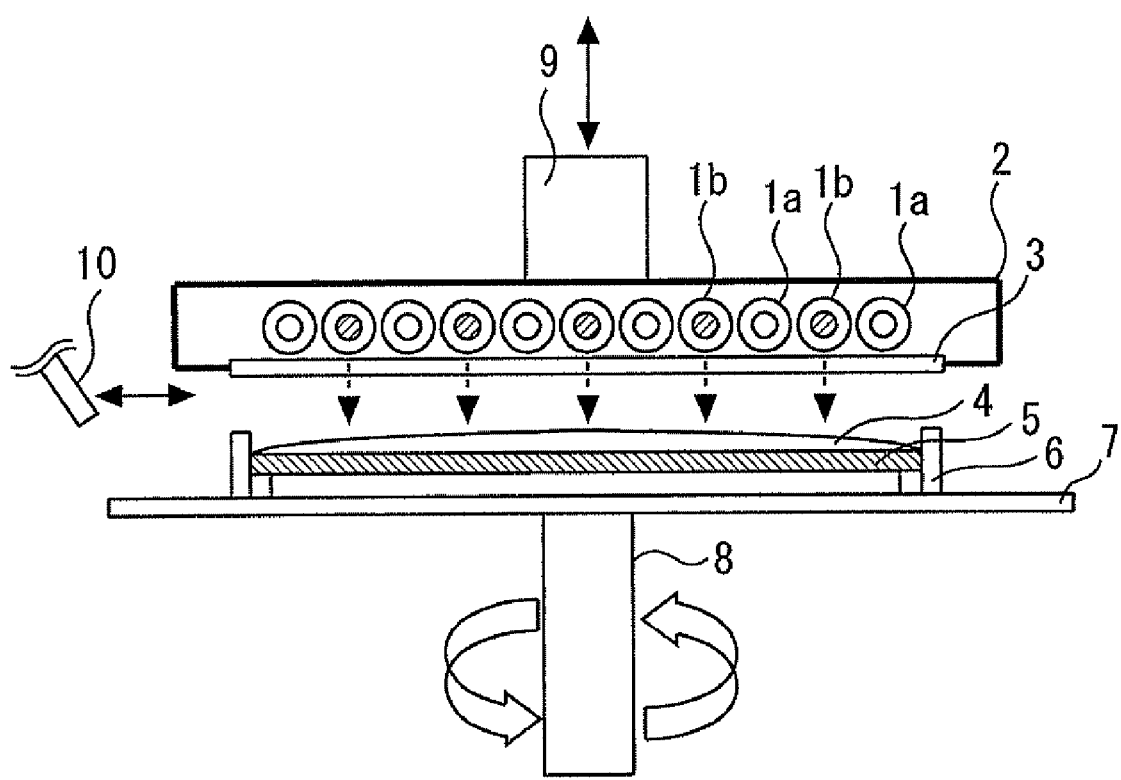

FIGS. 1 and 2 are schematic sectional views for illustrating a wet etching apparatus according to a first embodiment of the present invention. Specifically, FIG. 1 is a diagram showing the wet etching apparatus before applying a chemical solution; and FIG. 2 is a diagram showing the wet etching apparatus after applying the chemical solution.

As FIGS. 1 and 2 show, a substrate 5 whereon a film to be etched (film to be processed) is formed is rotatably held on a rotating stage 7. Specifically, a plurality of pins 6 are installed on the rotating stage 7, and the end portion (edge portion) of the substrate 5 is held by these pins 6. Here, the substrate 5 is, for example, a silicon substrate or a glass substrate. The substrate 5 may also be held by an electrostatic chuck in place of the pins 6.

The etching apparatus has a nozzle 10 for supplying a chemical solution 4 or ultra-pure water onto the substrate 5 (i.e. film to be processed).

A rotating shaft 8 is installed on the center of the rotating stage 7. When the rotating stage 7 rotates around the rotating shaft 8, the substrate 5 also rotates at a desired rotating speed. The rotating stage 7 rotates at a rotating speed of, for example, about 300 to 500 rpm during supplying of the chemical solution 4, and about 2,000 to 3,000 rpm during drying.

The film to be etched is, for example, a high-k dielectric film (hereafter referred to as "high-k film") such as $HfO_2$ film and HfAlO film formed using an ALD (atomic layer deposition) method and annealing (PDA: post deposition annealing) treatment.

Above the substrate 5, a lamp house 2 is disposed as the ultraviolet-light radiating apparatus. The lamp house 2 in the first embodiment is the apparatus that enables both surface reforming of the film to be etched and break of the molecular bonds of the film.

The lamp house 2 accommodates first lamps (first ultraviolet-light radiating units) 1a for radiating ultraviolet light having a wavelength of 200 nm or shorter, and second lamps (second ultraviolet-light radiating units) 1b for radiating ultraviolet light having a wavelength longer than 200 nm.

The first lamps 1a radiate ultraviolet light for removing organic coatings (e.g., oil) formed on the film to be etched due to environmental contamination, and for making the surface of the film to be etched hydrophilic. Although the details will be described later, since the ultraviolet light radiated from the first lamps 1a has a high absorption coefficient to oxygen, oxygen present in the vicinity of the film to be etched is excited to generate oxygen radicals (also referred to as "active oxygen") and ozone gas. As the first lamps 1a, for example, $Xe_2$ (172 nm) excimer lamps or low-pressure mercury lamps can be used.

The second lamps 1b radiate ultraviolet light having energy higher than the binding energy of the constituent molecules of the film, and radiate for break the bonds of the molecules. The energy of the ultraviolet light can be controlled by the radiating time of the ultraviolet light, and the radiating time is, for example, 10 to 200 seconds. Although the details will be described later, the second lamps 1b radiate ultraviolet light to the film to be etched through a chemical solution 4 coated on the film to be etched. As the second lamps 1b, for example, KrCl (222 nm) excimer lamps can be used. Since the ultraviolet light radiated from the second lamps 1b has a low absorption coefficient to oxygen, the light energy is efficiently transmitted to the film to be etched.

On the lower surface of the lamp house 2 is formed an opening having the size same as, or larger than the size of the substrate 5. This opening is closed up with a light-transmitting window 3 formed of a quartz glass (hereafter referred to as "quartz glass window") having a high transmissivity to ultraviolet light from the lamps 1a and 1b.

The inside of the lamp house 2 sealed with the quartz glass window 3 is filled with an inert gas such as nitrogen. Thereby, the ultraviolet light, having a high absorption coefficient to oxygen, radiated from the first lamps 1a is prevented from attenuation in the lamp house 2.

The intensity of the ultraviolet light radiated from the second lamp 1b at the quartz glass window 3 is preferably 5 to 20 $mW/cm^2$.

On the upper surface of the lamp house 2, a drive unit 9 is installed for driving the lamp house 2 in the vertical direction.

Next, operation of the wet etching apparatus, that is wet etching of the film to be etched will be described.

First, as FIG. 1 shows, a substrate 5 whereon a film to be etched (e.g., $HfO_2$ film) is formed is held by pins 6 on the rotating stage 7. Next, the lamp house 2 is lowered using the drive unit 9, and the first lamps 1a are turned on. Thus, in the state wherein substrate 5 is disposed in an atmosphere containing oxygen (e.g., the air), ultraviolet light having a wavelength of 200 nm or shorter is radiated from the first lamps 1a on the film to be etched. The ultraviolet-light radiation causes oxygen in the vicinity of the film to be excited, thereby generating oxygen radicals and ozone gas. The oxygen radicals and ozone gas decompose the organic coatings formed on the film to be etched, and vaporize the coatings as carbon dioxide and water vapor. Thereby, the surface of the film to be etched is reformed to be hydrophilic. Thereafter, the first lamps 1a are turned off, and the lamp house 2 is elevated using the drive unit 9.

Next, the chemical solution 4 containing a phosphoric-acid-based etchant is supplied on the film to be etched from the nozzle, while rotating the substrate 5 at a rotation speed of 300 to 500 rpm by rotating the rotating stage 7. Thereby, the chemical solution 4 is thinly and evenly coated on the hydrophilic film to be etched. At this time, the chemical solution 4 is coated without running off the substrate 5.

Figure 3:
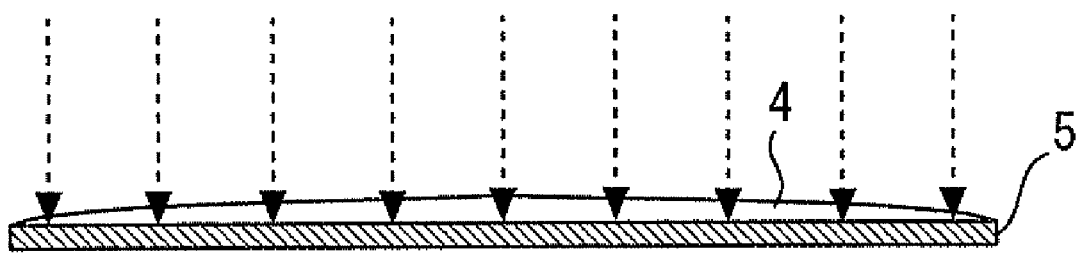
FIG. 3 is a view illustrating a thin coating of a chemical solution on a film to be etched, on a substrate.

The lamp house 2 is lowered in the vicinity of the substrates using the drive unit 9 so that the quartz glass window 3 does not interfere with the pins 6, as FIG. 2 shows. Ultraviolet light is radiated from the second lamps 1b, that has previously been turned on, to the film to be etched ($HfO_2$ film) through the chemical solution 4. Since the chemical solution 4 is thinly coated, as FIG. 3 shows, the ultraviolet light is radiated on the film to be etched on the substrate 5. The light energy of the ultraviolet light breaks the bonds of the molecules of the film to be etched (Hf—O bonds of the $HfO_2$ film), and etching reaction proceeds by the etchant contained in the previously coated chemical solution 4.

After desired wet etching, the second lamps 1b are turned off, the lamp house 2 is elevated using the drive unit 9, and ultra-pure water is ejected from the water-cleaning nozzle onto the substrate 5 to wash away the chemical solution 4 remaining on the substrate 5.

Finally, the substrate 5 is rotated at about 2,000 to 3,000 rpm using the rotating stage 7 to shake off the ultra-pure water on the substrate 5, thereby drying the substrate 5.

In the first embodiment, as described above, after ultraviolet light having a wavelength of 200 nm or shorter is radiated from first lamps 1a to the film to be etched, a chemical solution 4 is coated on the film, and wet etching is performed while radiating ultraviolet light having a wavelength longer than 200 nm from second lamps 1b to the film through the chemical solution 4.

According to the first embodiment, organic coatings formed on the surface of the film to be etched can be removed by the ultraviolet light from the first lamps 1a in the air, and the surface of the film to be etched can be made hydrophilic. Therefore, the chemical solution 4 can be thinly and evenly coated on the surface of the hydrophilic film to be etched. Thus, since the high wetting properties of the chemical solution 4 can be obtained, and the chemical solution 4 can evenly act within the surface of the substrate 5. Accordingly, the uniformity of the etching rate within the substrate can be improved.

Furthermore, ultraviolet light from the second lamps 1b is radiated to the film to be etched without the attenuation of energy in the air and in the chemical solution 4. Therefore, wet etching can be performed in the state wherein the molecular bonds of the film are broken most, and the etching rate can be significantly increased.

Therefore, the present invention can provide an etching apparatus and an etching method that can achieve a high etching rate, and excel in the uniformity of the etching rate within the substrate.

In order to break molecular bonds, it is considered to be advantageous because high energy can be obtained when radiating ultraviolet light of a relatively short wavelength of 200 nm or shorter from the second lamps 1b.

Figure 5:
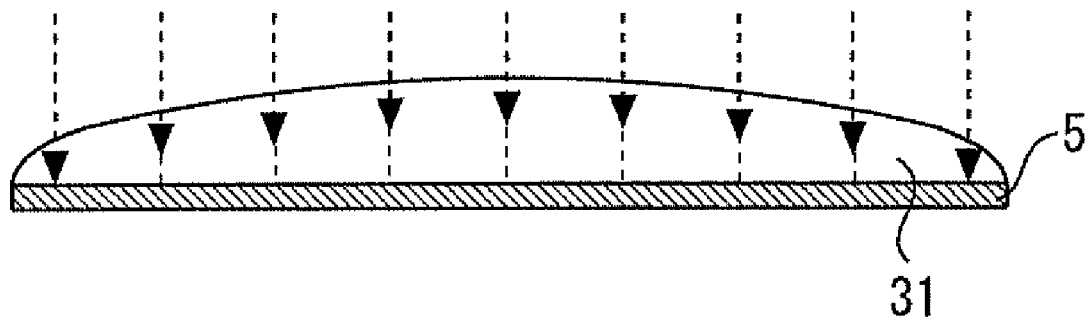
FIG. 5 is a view illustrating a thick coating of a chemical solution on a film to be etched, on a substrate.
Figure 6:
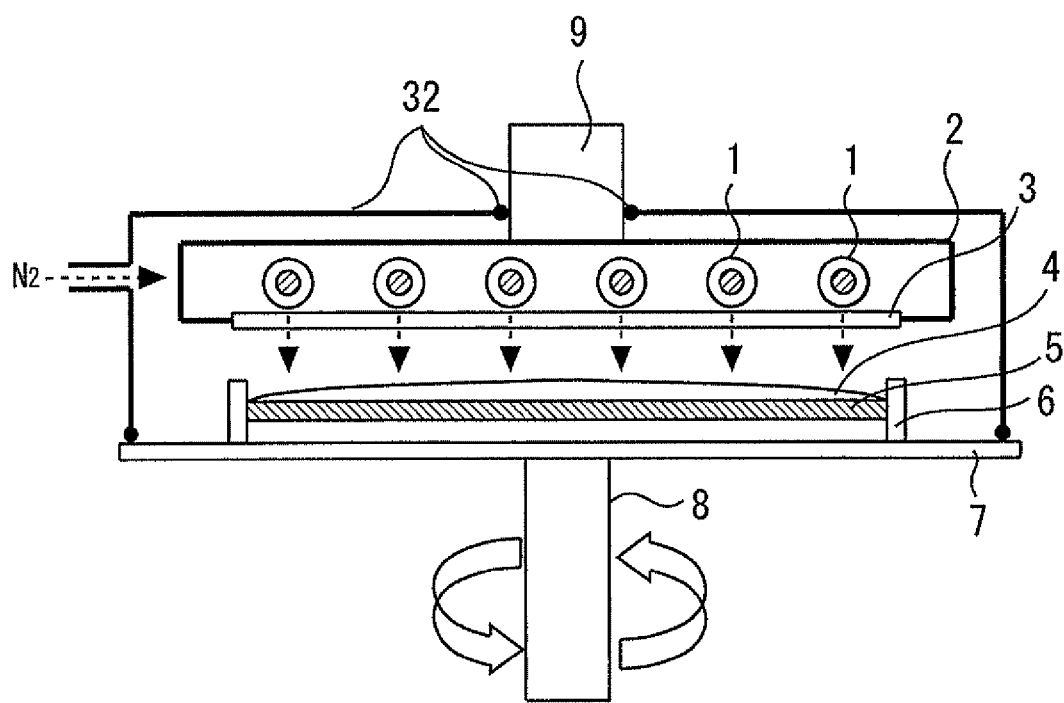
FIG. 6 is a schematic sectional view for illustrating a wet etching apparatus having a sealing mechanism.

However, as described above, since the ultraviolet light of a wavelength of 200 nm or shorter has a high absorption coefficient to oxygen, in order to prevent the attenuation of ultraviolet light, the atmosphere must be replaced with an inert gas such as nitrogen, and the oxygen content must be maintained to be 100 ppm by volume or less. To realize the above, nitrogen, which is a replacing gas, must be wastefully consumed, and various apparatuses must be installed to block off the atmosphere wherein the substrate is held from the air (refer to FIG. 5).

Whereas, in the embodiment, ultraviolet light of a wavelength longer than 200 nm having an extremely low absorption coefficient to oxygen is radiated to break molecular bonds. Therefore, ultraviolet light from the second lamps 1b can be radiated in the air without replacing the atmosphere. Thus, the wasteful consumption of the replacing gas can be avoided, no apparatuses for blocking out the atmosphere are required, and the apparatus can be simplified. Therefore, the manufacturing costs and the operating costs of the etching apparatus can be reduced. In addition, since time for replacing the atmosphere is not required, the etching time can be shortened, and the throughput can be improved.

The embodiment also provides the lamp house structure that enables both the surface reformation of the film to be etched and the break of molecular bonds of the film.

Although the embodiment is described for the case wherein the film to be etched is a high-k film, the present invention is not limited thereto, but can also be applied to a film having a low wet-etching rate, and is particularly preferable for dense thin films.

If the wavelength conditions are satisfied, an excimer laser may be used in place of excimer lamps.

Second Embodiment

FIGS. 4A to 4D are sectional process views for illustrating a method of manufacturing a semiconductor device according to a second embodiment of the present invention.

Figure 4A:
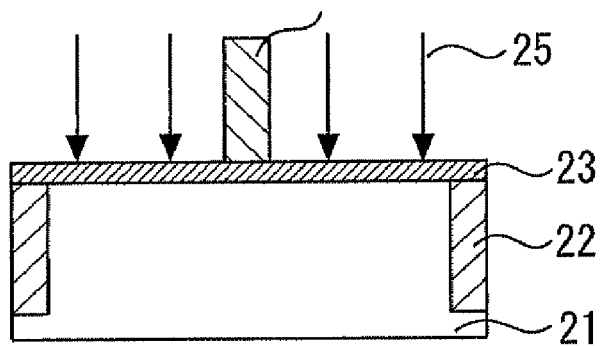
FIGS. 4A to 4D are sectional process views for illustrating a method of manufacturing a semiconductor device according to a second embodiment of the present invention.

First, as shown in FIG. 4A, an element isolating 22 made from oxide is formed in a substrate 21. A high-k film 23, for example $HfO_2$ film and HfAlO film, is formed on the entire surface of the substrate 21 by an ALD method and annealing treatment. A polysilicon film is formed on the high-k film 23. A resist pattern (not shown) is formed on the polysilicon film. The polysilicon film is patterned using the resist pattern as a mask to form a gate electrode 24. Next, ultraviolet light 25 having a wavelength of 200 nm or shorter is radiated on the high-k film 23 in atmosphere containing oxygen. The ultraviolet-light radiation causes oxygen in the vicinity of the high-k film 23 to be excited, thereby generating oxygen radicals and ozone gas. The oxygen radicals and ozone gas decompose organic coatings (not shown) formed on the high-k film 23, and vaporize the organic coatings as carbon dioxide and water vapor. Thereby, a surface of the high-k film 23 is reformed to be hydrophilic.

Figure 4B:
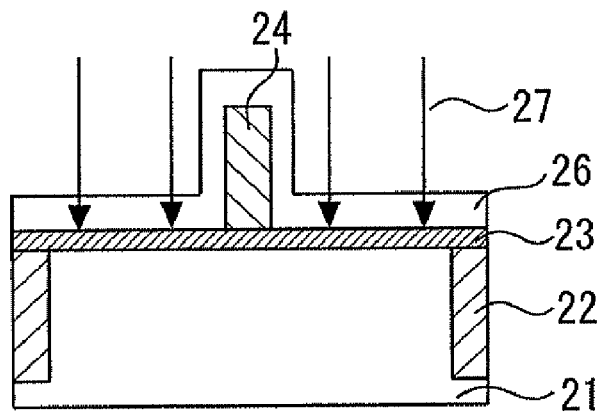
Figure 4C:
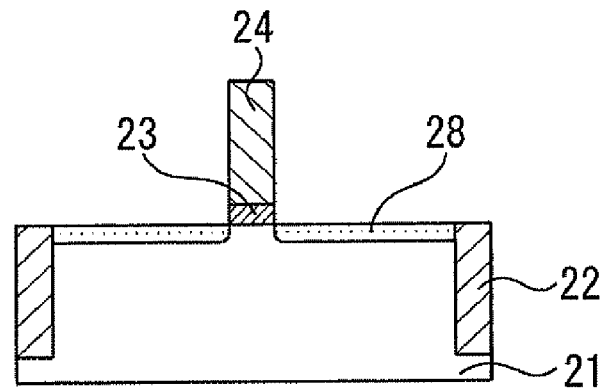

Next, as shown in FIG. 4B, chemical solution 26 containing a phosphoric-acid-based etchant is coated by a spin-coating method on the entire surface of the substrate 21 including the surface of the high-k film 23. Next, ultraviolet light 27 having a wavelength longer than 200 nm is radiated to the high-k film 23 through the chemical solution 26. The light energy of the ultraviolet light 27 breaks the bonds of the constituent molecules of the high-k film 23 (for example, Hf—O bonds of the $HfO_2$ film), and etching reaction proceeds by the etchant contained in the coated chemical solution 26. Thus, the high-k film 23 is patterned, as shown in FIG. 4C. The above-mentioned patterning of the high-k film 23 is performed using the wet etching apparatus according to the first embodiment. Next, extension regions 28 are formed by ion implantation of impurities using the gate electrode 24 and the high-k film 23 as a mask.

Figure 4D:
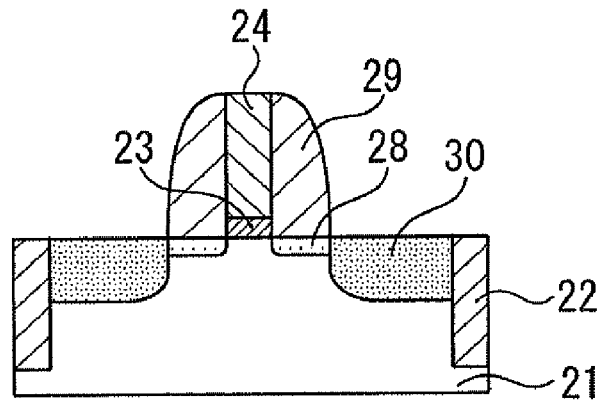

Next, as shown in FIG. 4D, sidewalls 29 made from nitride are formed on the sides of the gate electrodes 24 and high-k film 23. Finally, source/drain regions 30 are formed by ion implantation of impurities using the gate electrode 24, the high-k film 23 and the sidewalls 29 as a mask.

According to the second embodiment, as described above, after ultraviolet light 25 having a wavelength of 200 nm or shorter is radiated to the high-k film 23, a chemical solution 26 is coated on the high-k film 23, and wet etching is performed while radiating ultraviolet light 27 having a wavelength longer than 200 nm to the high-k film 23 through the chemical solution 26.

According to the second embodiment, organic coatings formed on the surface of the high-k film 23 can be removed by the ultraviolet light 25 in the air (atmosphere containing oxygen), and the surface of the high-k film 23 can be made hydrophilic. Therefore, the chemical solution 26 can be thinly and evenly coated on the surface of the hydrophilic high-k film 23. Thus, since the high wetting properties of the chemical solution 26 can be obtained, and the chemical solution 26 can evenly act within the high-k film 23. Accordingly, the uniformity of the etching rate of the high-k film 23 within the substrate can be improved.

Furthermore, ultraviolet light 27 is radiated to the high-k film 23 without the attenuation of energy in the air and in the chemical solution 26. Therefore, wet etching can be performed in the state wherein the molecular bonds of the high-k film 26 are broken most, and the etching rate can be significantly increased.

This invention, when practiced illustratively in the manner described above, provides the following major effects:

According to the present invention, a wet etching apparatus and a wet etching method that can achieve a high etching rate, and excel in the uniformity of the etching rate within the substrate, can be provided.

Further, the present invention is not limited to these embodiments, but variations and modifications may be made without departing from the scope of the present invention.

The entire disclosure of Japanese Patent Application No. 2003-081776 filed on Mar. 25, 2003 containing specification, claims, drawings and summary are incorporated herein by reference in its entirety.

What is claimed is:

1. A wet etching method comprising:
   irradiating a high-k dielectric film to be etched and on a substrate with ultraviolet light having a wavelength not exceeding 200 nm;
   applying a coating of a chemical solution to the high-k dielectric film after irradiating the high-k dielectric film with ultraviolet light having a wavelength not exceeding 200 nm; and
   irradiating the high-k dielectric film through the chemical solution with ultraviolet light having a wavelength longer than 200 nm and breaking bonds of molecules of the high-k dielectric film.

2. The wet etching method according to claim 1, including irradiating the high-k dielectric film with the ultraviolet light having a wavelength longer than 200 nm and having energy higher than binding energy of constituent molecules of the high-k dielectric film.

3. The wet etching method according to claim 1, including irradiating the high-k dielectric film with the ultraviolet light having a wavelength not exceeding 200 nm in an ambient including oxygen and generating oxygen radicals and ozone proximate the film.

4. The wet etching method according to claim 3, including removing an organic coating from a surface of the film with the oxygen radicals and ozone.

5. A method of manufacturing a semiconductor device, comprising:
   forming a high-k dielectric film on a substrate;
   forming a gate electrode on the high-k dielectric film;
   irradiating the high-k dielectric film with ultraviolet light having a wavelength not exceeding 200 nm;
   applying a coating of a chemical solution to the high-k dielectric film after irradiating with the ultraviolet light having a wavelength not exceeding 200 nm;
   irradiating the high-k dielectric film, through the chemical solution, with ultraviolet light having a wavelength longer than 200 nm and breaking bonds of molecules of the high-k dielectric film; and
   forming diffusion regions in the substrate after irradiating with the ultraviolet light having a wavelength longer than 200 nm.

6. The method of manufacturing a semiconductor device according to claim 5, including irradiating the high-k dielectric film with the ultraviolet light having a wavelength longer than 200 nm and having energy higher than binding energy of constituent molecules of the high-k dielectric film.

7. The method of manufacturing a semiconductor device according to claim 5, including irradiating the high-k dielectric film with the ultraviolet light having a wavelength not exceeding 200 nm in an ambient including oxygen and generating oxygen radicals and ozone proximate the high-k dielectric film.

8. The method of manufacturing a semiconductor device according to claim 7, including removing an organic coating from a surface of the high-k dielectric film with the oxygen radicals and ozone.

* * * * *